(12) United States Patent
Wu et al.

(10) Patent No.: US 7,491,575 B2
(45) Date of Patent: Feb. 17, 2009

(54) FABRICATING ZINC OXIDE SEMICONDUCTOR USING HYDROLYSIS

(75) Inventors: Yiliang Wu, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 222 days.

(21) Appl. No.: 11/497,826

(22) Filed: Aug. 2, 2006

(65) Prior Publication Data
US 2008/0032443 A1 Feb. 7, 2008

(51) Int. Cl.
*H01L 21/00* (2006.01)
*H01L 21/16* (2006.01)
(52) U.S. Cl. ............... 438/104; 438/483; 257/E21.591
(58) Field of Classification Search .......... 438/104, 438/151, 152, 153, 483, 500, 502
See application file for complete search history.

(56) References Cited

U.S. PATENT DOCUMENTS 6,570,183 B1 * 5/2003 Park et al. ............... 257/66

2006/0057766 A1 * 3/2006 Jia et al. ............... 438/85
2006/0135743 A1 * 6/2006 Park et al. ............... 528/405
2006/0275948 A1 * 12/2006 Takamatsu et al. .......... 438/104
2007/0176199 A1 * 8/2007 Shibata ............... 257/103

OTHER PUBLICATIONS

E. Fortunato et al., "Fully Transparent ZnO Thin-Film Transistor Produced at Room Temperature," *Adv. Mater.*, vol. 17, No. 5, pp. 590-594 (Mar. 8, 2005).
B. J. Norris et al., "Spin coated zinc oxide transparent transistors," *J. Phys. D: Appl. Phys.*, vol. 36, pp. L105-L107 (2003).
B. Sun et al., "Solution-Processed Zinc Oxide Field-Effect Transistors Based on Self-Assembly of Colloidal Nanorods," *Nano Lett.*, vol. 5, No. 12, pp. 2408-2413 (2005).

* cited by examiner

Primary Examiner—Phat X Cao
Assistant Examiner—Nga Doan
(74) Attorney, Agent, or Firm—Zosan Soong

(57) ABSTRACT

A process for fabricating at least one semiconductor layer of an electronic device including: performing on a composition including a hydrolyzable zinc compound a number of activities including: (a) hydrolyzing at least a portion of the hydrolyzable zinc compound to form zinc oxide; (b) liquid depositing; and (c) optionally heating, wherein the activities (a), (b), and (c) are each accomplished a number of times in any effective arrangement, resulting in the at least one semiconductor layer comprising the zinc oxide.

20 Claims, 2 Drawing Sheets

FABRICATING ZINC OXIDE SEMICONDUCTOR USING HYDROLYSIS

BACKGROUND OF THE INVENTION

Zinc oxide is a promising channel semiconductor in thin film transistors ("TFTs") for fabricating low cost TFT circuits for large area displays and other low cost electronics. Conventional fabrication processes for a zinc oxide semiconductor layer for TFTs may be costly, involving high equipment investment and complex processing techniques. Thus, there is a need addressed by embodiments of the present invention for simpler, less costly fabrication processes, preferably at a plastic substrate compatible temperature, for a zinc oxide semiconductor layer for electronic devices.

The following documents provide background information:

E. Fortunato et al., "Fully Transparent ZnO Thin-Film Transistor Produced at Room Temperature," *Adv. Mater.*, Vol. 17, No. 5, pp. 590-594 (Mar. 8, 2005).

B. J. Norris et al., "Spin coated zinc oxide transparent transistors," *J. Phys. D: Appl. Phys.*, Vol. 36, pp. L105-L107 (2003).

B. Sun et al., "Solution-Processed Zinc Oxide Field-Effect Transistors Based on Self-Assembly of Colloidal Nanorods," *Nano Lett.*, Vol. 5, No. 12, pp. 2408-2413 (2005)

SUMMARY OF THE DISCLOSURE

There is provided in embodiments a process for fabricating at least one semiconductor layer of an electronic device comprising: performing on a composition including a hydrolyzable zinc compound a number of activities including:

(a) hydrolyzing at least a portion of the hydrolyzable zinc compound to form zinc oxide;

(b) liquid depositing; and (c) optionally heating, wherein the activities (a), (b), and (c) are each accomplished a number of times in any effective arrangement, resulting in the at least one semiconductor layer comprising the zinc oxide.

There is further provided in embodiments a process for fabricating at least one semiconductor layer of an electronic device comprising:

liquid depositing a composition comprising a hydrolyzable zinc compound and a liquid resulting in a liquid deposited composition;

hydrolyzing at least a portion of the hydrolyzable zinc compound in the liquid deposited composition to form zinc oxide, resulting in a hydrolyzed composition comprising the zinc oxide; and optionally heating the hydrolyzed composition, wherein the liquid depositing, the hydrolyzing, and the optional heating are each accomplished a number of times, resulting in the at least one semiconductor layer comprising the zinc oxide.

In additional embodiments, there is provided a process comprising:

fabricating a thin film transistor comprising at least one semiconductor layer, a gate electrode; a source electrode; a drain electrode; and a gate dielectric, wherein the at least one semiconductor layer is formed by a semiconductor fabrication process comprising: performing on a composition including a hydrolyzable zinc compound a number of activities including:

(a) hydrolyzing at least a portion of the hydrolyzable zinc compound to form zinc oxide;

(b) liquid depositing; and (c) optionally heating, wherein the activities (a), (b), and (c) are each accomplished a number of times in any effective arrangement, resulting in the at least one semiconductor layer comprising the zinc oxide.

BRIEF DESCRIPTION OF THE DRAWINGS

Other aspects of the present invention will become apparent as the following description proceeds and upon reference to the following figures which represent illustrative embodiments.

Unless otherwise noted, the same reference numeral in different Figures refers to the same or similar feature.

DETAILED DESCRIPTION

Figure 1:
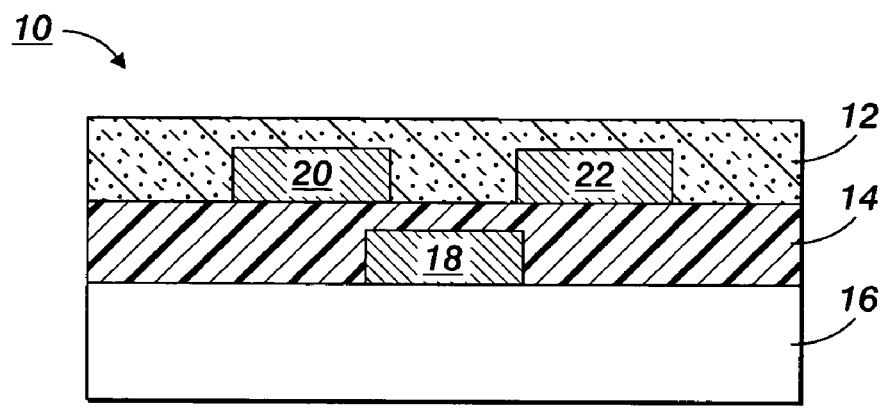
FIG. 1 represents a first embodiment of a TFT made using the present process.

As used herein, room temperature refers to a temperature ranging from about 20 to about 25 degrees C.

In embodiments, the present process involves fabricating at least one semiconductor layer of an electronic device comprising: performing on a composition including a hydrolyzable zinc compound a number of activities including:

(a) hydrolyzing at least a portion of the hydrolyzable zinc compound to form zinc oxide;

(b) liquid depositing; and (c) optionally heating, wherein the activities (a), (b), and (c) are each accomplished a number of times in any effective arrangement, resulting in the at least one semiconductor layer comprising the zinc oxide.

The phrase "any effective arrangement" refers to any arrangement (e.g., sequential, simultaneous, or a combination thereof) of the above activities (a), (b) and optional (c), each activity accomplished a number of times, to achieve the desired semiconductor layer comprising zinc oxide. To illustrate the meaning of "any effective arrangement", the following examples are provided of embodiments of the present process where each activity may be present 0, 1, 2, 3 or more times:

(b)+(a)+(c)

(a)+(b)+(a)+(c)

(a)+(b)+(a)

(b)+(a)+(b)+(a)+(c)

(b)+(a)+(c)+(b)+(a)+(c)+(b)+(a)+(c)

(a)+(b)+(c)+(b)+(a)+(c)

(b) and (a)+(a)+(c)

where "and" in the above example indicates that (b) and (a) occur simultaneously.

In embodiments, a particular sequence of the activities may be indicated such as for instance liquid depositing, hydrolyzing, and optional heating; in such embodiments where a particular sequence is indicated, any optional additional occurrence(s) of each activity may be performed before, between, after the recited activities, and/or even performed simultaneously with the recited activities.

The various activities (hydrolyzing, liquid depositing, and optional heating) are each accomplished a suitable number of times. The hydrolyzing can be accomplished a number of times such as 1, 2, 3, or more, particularly 1 to 2 times. The liquid depositing can be accomplished a number of times such as 1, 2, 3, or more, particularly 1 to 2 times. The heating can be accomplished a number of times such as 0 (since the heating is optional), 1, 2, 3, or more, particularly from 0 to 2 times.

Unless otherwise indicated ("composition" versus "hydrolyzed composition"), for convenience, the same term "composition" is used in the present process regardless of the stage of the present process or the activity or activities performed on the "composition" even if the chemical nature and/or physical properties of the "composition" changes during the present process.

It is understood that optional additional occurrence(s) of the liquid depositing can be accomplished with the same or different composition used in the first occurrence of the liquid depositing. The compositions used in any multiple occurrences of the liquid depositing can be different in for example chemical nature (e.g., different type of hydrolyzable zinc compound). In embodiments, compositions having the same components but differing in component concentrations are considered the "same."

Hydrolysis (or hydrolyzing) involves a reaction of the hydrolyzable zinc compound and water to form zinc oxide. The water may come from ambient conditions (that is, humidity) and/or intentionally added in a suitable amount. Hydrolysis could take place prior to, during, and/or after the liquid depositing. In embodiments, the hydrolysis is performed at a temperature from about 5 to about 100 degrees C., or from room temperature to about 80 degrees C. The hydrolysis is performed at any suitable humidity level. In embodiments, the hydrolysis is performed at a relative humidity level from about 10% to about 95%, or from about 10% to about 90%, or from about 30% to about 80%. The hydrolysis is performed at any atmosphere, for example, air, nitrogen, or argon. In embodiments, the hydrolysis is performed for a period of time from about 1 second to about 2 weeks, or from about 1 minute to about 1 week, or from about 1 hour to about 1 day.

In embodiments, the hydrolysis takes place spontaneously when the hydrolyzable zinc compound is in contact with water. In other embodiments, the hydrolysis takes place with external stimulus such as heating, exposing to light, and/or changing pH.

The hydrolysis converts at least a portion of the hydrolyzable zinc compound to zinc oxide, thereby increasing the zinc oxide concentration in the composition. In embodiments, the hydrolysis (the total number of occurrences whether one, two, or more times) converts a majority (that is, more than 50 mol %) of the hydrolyzable zinc compound to zinc oxide such as for example conversion of more than about 80 mol % of the hydrolyzable zinc compound to zinc oxide, or conversion of about 80 mol % to 100 mol % of the hydrolyzable zinc compound to zinc oxide. The conversion of zinc compound to zinc oxide can be determined with any suitable method such as for example, elemental analysis and inductively coupled plasma (ICP) spectroscope. In the event of any significant variation between the results of elemental analysis and ICP, the elemental analysis method is preferred for determining the conversion of zinc compound to zinc oxide.

The composition and semiconductor layer optionally include one or more other semiconductor materials in addition to zinc oxide. These other semiconductor materials include for example polythiophenes, oligothiophenes, triarylamine polymers, polyindolocarbazoles, and the like, which can be present in embodiments ranging for example from about 5% to about 99%, or from about 30% to about 80%, based on the weight of the composition/semiconductor layer.

Liquid depositing can be accomplished by any liquid deposition techniques such as for instance spin coating, blade coating, rod coating, screen printing, dip coating, stencil printing, ink jet printing, offset printing, stamping and the like. In embodiments, ink jet printing is used. Liquid depositing could be performed at any suitable temperature under any suitable humidity level and atmospheres. In embodiments, the liquid depositing is carried out at room temperature. In embodiments, the liquid depositing is carried out at the humidity level as discussed above. In embodiments, the liquid depositing is performed under ambient air condition. In other embodiments, the liquid depositing is performed under inert atmospheres such as under nitrogen or argon.

Heating refers to a heat treatment at a temperature or several temperatures within a range for instance of between about 60° C. and about 700° C. The heating is accomplished at a maximum temperature for example from about 100° C. to about 700 ° C., particularly from about 150° C. to about 500° C. The heating can be accomplished for example in an instant heating manner at a certain temperature using a pre-heated heating equipment. In embodiments, the heating can be accomplished in a gradual heating manner with a heating rate that the heating equipment can achieve, ranging for example from about 0.5 to about 100° C. per minute starting from room temperature or starting from a temperature between about 25° C. to about 100° C. In further embodiments, the heating can also be accomplished step-wise at several temperatures, such as, for example, at about 300° C., then at about 400° C., and then at about 500° C. In embodiments, the heating can also be accomplished step-wise at several temperatures, combined with gradual heating such as, for example, at about 300° C. for about 30 min, then gradually increase to about 400° C. at a heating rate of about 10° C./min, and then at about 400° C. for about 30 min. The heating can also be accomplished for instance at a higher temperature and then at a lower temperature such as first at about 500° C. and then at about 400° C.

Without being limited by any principle, it is believed that in embodiments the heating may have one or more of the following effects on the formation of the semiconductor layer comprising zinc oxide. First, heating will help to crystallize the zinc oxide to form crystallinize zinc oxide, particularly for the heating performed at a relatively high temperature such as from about 400 to about 700° C. Second, heating will help to condense the semiconductor layer so that zinc oxide particles will have closer inter-contact. The semiconductor layer will have less voids. Third, heating will help to evaporate organic components from hydrolysis in the semiconductor layer. Heating also can decompose residual hydrolyzable zinc compound in the semiconductor layer. In embodiments, the heating is performed at a temperature which is compatible to a plastic substrate or at a temperature that does not cause adverse changes in the properties of previously deposited layer(s) or the substrate (whether single layer substrate or multilayer substrate). The heating temperature is for example below about 250° C., or below about 200° C. or below about 150° C.

To facilitate hydrolysis, the composition comprises a hydrolyzable zinc compound. In embodiments, the hydrolyzable zinc compound is an organic hydrolyzable zinc compound. Representative hydrolyzable zinc compounds are diethylzinc, bi(cyclohexyl) zinc, zinc 2-methoxyethoxide, and a mixture thereof. The composition may or may not comprise a solvent. For instance, if hydrolysis is prior to liquid depositing, the composition for hydrolysis in embodiments may comprise a solvent. If hydrolysis is after liquid depositing, the composition for hydrolysis may not in embodiments comprise a solvent.

In embodiments, the composition comprises a liquid (which may function as a solvent for the hydrolyzable zinc compound in embodiments) selected from for instance alcohol, ether, ester, aromatics, and a mixture thereof. In embodiments, the liquid is selected from toluene, xylene, chloroform, dichloromethane, chlorobenzene, dichlorobenzene, tetrahydrofuran, N,N-dimethylformamide, propanol, butanol, pyridine, a mixture thereof, and the like. The concentration of the hydrolyzable zinc compound in the composition is from about 0.3 to about 30 percent by weight, or from about 0.5 to about 20 percent by weight, particularly from about 1 to about 10 percent by weight, based on the starting ingredient hydrolyzable zinc compound. Representative concentration of the liquid is from about 70 to about 99.7 percent by weight, or from about 80 to about 99 percent by weight, or from about 90 to about 95 percent by weight of the composition.

In embodiments, the zinc oxide in the semiconductor layer is predominantly crystalline. Suitable techniques such as X-ray diffraction can be used to characterize the crystallinity of the zinc oxide semiconductor layer. In embodiments, the crystallinity is more than 50%, or more than about 80%, or more than about 90%. The crystalline zinc oxide may adopt any orientation in the semiconductor layer. In embodiments, the crystalline zinc oxide has a preferential orientation with its c-axis perpendicular to the plane of the semiconductor layer. In reflection-mode X-ray diffraction, this preferential orientation refers to the crystalline zinc oxide in the semiconductor layer having a stronger X-ray diffraction intensity of the (002) peak than the other diffraction peaks such as (100) and (101) peaks.

The present zinc oxide semiconductor layer can be used in electronic devices such as solar cell, light emitting diode, and transistors for active matrix displays and signage, and radio-frequency identification (RFID) tags, etc.

In FIG. 1, there is schematically illustrated an TFT configuration 10 comprised of a substrate 16, in contact therewith a metal contact 18 (gate electrode) and a layer of a gate dielectric layer 14 on top of which two metal contacts, source electrode 20 and drain electrode 22, are deposited. Over and between the metal contacts 20 and 22 is a zinc oxide semiconductor layer 12 as illustrated herein.

Figure 2:
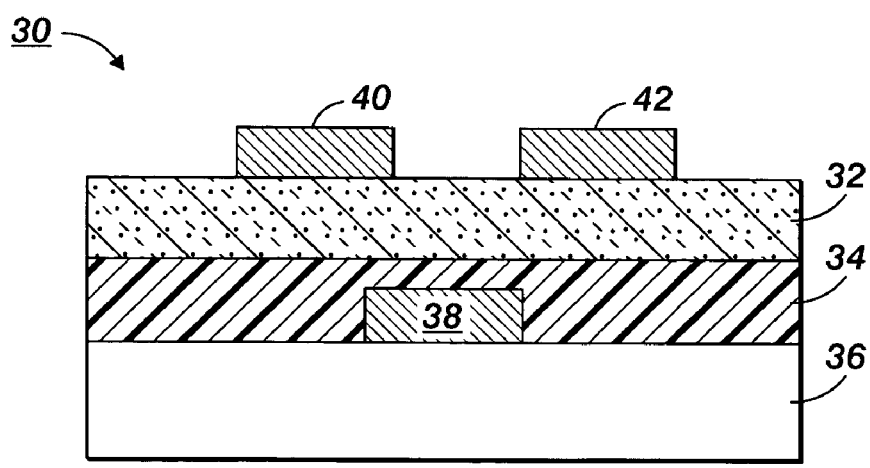
FIG. 2 represents a second embodiment of a TFT made using the present process.

FIG. 2 schematically illustrates another TFT configuration 30 comprised of a substrate 36, a gate electrode 38, a source electrode 40 and a drain electrode 42, a gate dielectric layer 34, and a zinc oxide semiconductor layer 32.

Figure 3:
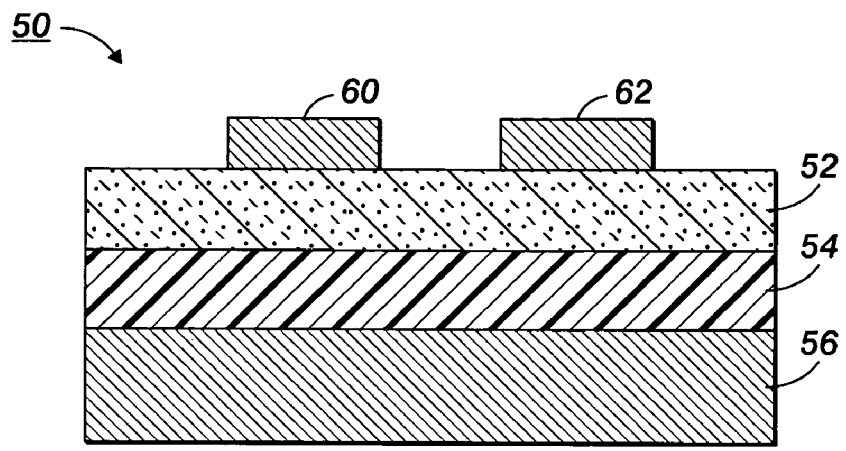
FIG. 3 represents a third embodiment of a TFT made using the present process.

FIG. 3 schematically illustrates a further TFT configuration 50 comprised of a heavily n-doped silicon wafer 56 which acts as both a substrate and a gate electrode, a thermally grown silicon oxide insulating layer 54 as gate dielectric, and a zinc oxide semiconductor layer 52, on top of which are deposited a source electrode 60 and a drain electrode 62.

Figure 4:
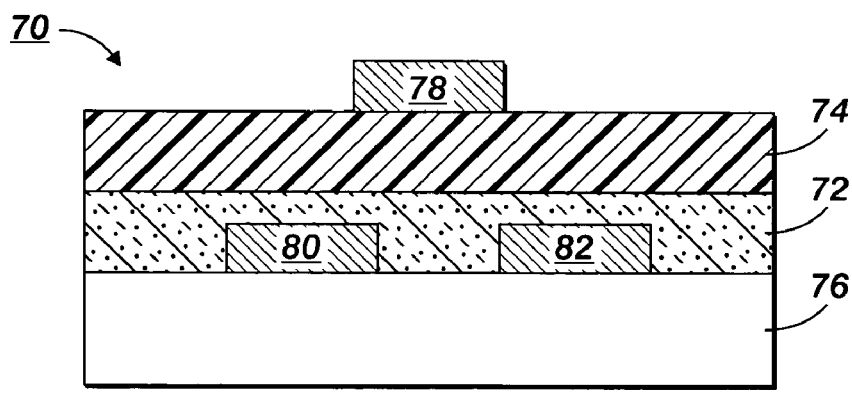
FIG. 4 represents a fourth embodiment of a TFT made using the present process.

FIG. 4 schematically illustrates an additional TFT configuration 70 comprised of substrate 76, a gate electrode 78, a source electrode 80, a drain electrode 82, a zinc oxide semiconductor layer 72, and a gate dielectric layer 74.

The composition and formation of the zinc oxide semiconductor layer are described herein.

The zinc oxide semiconductor layer has a thickness ranging for example from about 10 nanometers to about 1 micrometer, particularly a thickness of from about 20 to about 200 nanometers. The TFT devices contain a semiconductor channel with a width, W and length, L. The semiconductor channel width may be, for example, from about 1 micrometer to about 5 millimeters, with a specific channel width being about 5 micrometers to about 1 millimeter. The semiconductor channel length may be, for example, from about 1 micrometer to about 1 millimeter with a more specific channel length being from about 5 micrometers to about 100 micrometers.

The substrate may be composed of any suitable materials for instance silicon, glass, aluminum, or plastics. The thickness of the substrate may be from about 10 micrometers to over 10 millimeters with a representative thickness being from about 1 to about 10 millimeters for a rigid substrate such as glass plate or silicon wafer.

The gate electrode can be a thin metal film, a conducting polymer film, a conducting film made from conducting ink or paste or the substrate itself, for example heavily doped silicon. Examples of gate electrode materials include but are not restricted to aluminum, nickel, gold, silver, copper, zinc, indium, zinc-gallium oxide, indium tin oxide, indium-antimony oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode can be prepared by vacuum evaporation, sputtering of metals or conductive metal oxides, coating from conducting polymer solutions or conducting inks by spin coating, casting or printing. The thickness of the gate electrode ranges for example from about 10 to about 200 nanometers for metal films and in the range of about 1 to about 10 micrometers for polymer conductors. Typical materials suitable for use as source and drain electrodes include those of the gate electrode materials such as aluminum, zinc, indium, silver, gallium, cadmium, tin, conductive metal oxides such as zinc-gallium oxide, indium tin oxide, indium-antimony oxide, conducting polymers and conducting inks. In embodiments, the materials for the source drain electrodes are selected from those materials have doping effect to zinc oxide to increase the conductive of the zinc oxide, for example, aluminum gallium, cadmium, tin, and indium. Typical thicknesses of source and drain electrodes are about, for example, from about 40 nanometers to about 1 micrometer with the more specific thickness being about 100 to about 400 nanometers.

The gate dielectric layer generally can be an inorganic material film or an organic polymer film. Illustrative examples of inorganic materials suitable as the gate dielectric layer include aluminum-titanium oxide, aluminum oxide, silicon oxide, silicon nitride, barium titanate, barium zirconium titanate and the like; illustrative examples of organic polymers for the gate dielectric layer include polyesters, polycarbonates, poly(vinyl phenol), polyimides, polystyrene, poly(methacrylate)s, poly(acrylate)s, epoxy resin and the like. The thickness of the gate dielectric layer is, for example from about 10 nanometers to about 2000 nanometers depending on the dielectric constant of the dielectric material used. A representative thickness of the gate dielectric layer is from about 100 nanometers to about 500 nanometers. The gate dielectric layer may have a conductivity that is for example less than about $10^{-12}$ S/cm.

In embodiments, the gate dielectric layer, the gate electrode, the semiconductor layer, the source electrode, and the drain electrode are formed in any sequence with the gate electrode and the semiconductor layer both contacting the gate dielectric layer, and the source electrode and the drain electrode both contacting the semiconductor layer. The phrase "in any sequence" includes sequential and simultaneous formation. For example, the source electrode and the drain electrode can be formed simultaneously or sequentially.

For a n-channel TFT, the source electrode is grounded and a bias voltage of generally, for example, about 0 volt to about 80 volts is applied to the drain electrode to collect the charge carriers transported across the semiconductor channel when a voltage of generally about −20 volts to about +80 volts is applied to the gate electrode.

The invention will now be described in detail with respect to specific representative embodiments thereof, it being understood that these examples are intended to be illustrative only and the invention is not intended to be limited to the materials, conditions, or process parameters recited herein. All percentages and parts are by weight unless otherwise indicated.

EXAMPLE

A TFT device having the configuration of FIG. 3 was prepared as follows. Diethylzinc (1.1M in toluene, Aldrich) was used as precursor to form the ZnO layer. The solution was first diluted with THF to 0.5 M, then spin coated onto n-doped silicon wafer which has 200 nm silicon oxide as dielectric layer. The resulting film was first aged at room temperature at a relative humidity about 40% for 24 hours to hydrolyze the zinc oxide precursor, then annealed at 110 degree C. for 30 min. Al electrodes were vacuum-deposited on top of the ZnO layer to form a series of transistors with different channel length and width. The devices were evaluated using Keithley 4200 SCS System. The saturated carrier mobility, μ, was calculated according to equation (1)

$$I_{SD}=C_i\mu(W/2L)(V_G-V_T)^2 \quad (1)$$

where $I_{SD}$=drain current at the saturated regime, W and L are respectively channel width and length, $C_i$ is the capacitance per unit area of the gate dielectric layer, and $V_G$ and $V_T$ are respectively gate voltage and threshold voltage. The transfer and output characteristics of the devices showed that ZnO was an n-type semiconductor. Using transistors with a dimension of W=5,000 μm and L=90 μm, the following properties were obtained: mobility: 0.003-0.004 cm²V.s; current on/off ratio: ~10⁵.

It will be appreciated that various of the above-disclosed and other activities and functions, or alternatives thereof, may be desirably combined into many other different systems or applications. Various presently unforeseen or unanticipated alternatives, variations, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A process for fabricating at least one semiconductor layer of an electronic device comprising: performing on a composition including a hydrolyzable zinc compound a number of activities including:
   (a) hydrolyzing at least a portion of the hydrolyzable zinc compound to form zinc oxide;
   (b) liquid depositing; and
   (c) optionally heating,
   wherein the activities (a), (b), and (c) are each accomplished a number of times in any effective arrangement, resulting in the at least one semiconductor layer comprising the zinc oxide wherein the hydrolyzing accomplished a number of times converts a majority of the hydrolyzable zinc compound to the zinc oxide.

2. The process of claim 1, wherein the composition consists essentially of water, an optional liquid, an optional other semiconductor material, and the hydrolyzable zinc compound.

3. The process of claim 1, wherein the activity (a) accomplished a number of times converts more than about 80 mol % of the hydrolyzable zinc compound to the zinc oxide.

4. The process of claim 1, wherein the hydrolyzable zinc compound is selected from diethylzinc, bi(cyclohexyl) zinc, zinc 2-methoxyethoxide, and a mixture thereof.

5. The process of claim 1, wherein for the activity (b) the composition comprises a liquid selected from alcohol, ether, ester, aromatics, and a mixture thereof.

6. The process of claim 1, wherein the activity (a) is performed during the activity (b).

7. The process of claim 1, wherein the liquid depositing is selected from the group consisting of spin coating, inkjet printing, dip coating, stencil printing, microcontact printing, and a mixture thereof.

8. The process of claim 1, wherein the heating is performed at a maximum temperature from about 100 degree C. to about 700 degree C.

9. The process of claim 1, wherein the zinc oxide is predominantly crystalline.

10. The process of claim 1, wherein the activities (a), (b), and (c) are each accomplished only once.

11. The process of claim 1, wherein the activities (a), (b), and (c) are each accomplished more than once in any effective arrangement.

12. The process of claim 1, wherein the hydrolysis is performed at a temperature from about room temperature to about 100 degree C. at about 10% to about 90% relative humidity level for about 1 min to about 1 week.

13. A process for fabricating at least one semiconductor layer of an electronic device comprising:
   liquid depositing a composition comprising a hydrolyzable zinc compound and a liquid resulting in a liquid deposited composition;
   hydrolyzing at least a portion of the hydrolyzable zinc compound in the liquid deposited composition to form zinc oxide, resulting in a hydrolyzed composition comprising the zinc oxide; and
   optionally heating the hydrolyzed composition,
   wherein the liquid depositing, the hydrolyzing, and the optional heating are each accomplished a number of times, resulting in the at least one semiconductor layer comprising the zinc oxide wherein the hydrolyzing accomplished a number of times converts a majority of the hydrolyzable zinc compound to the zinc oxide.

14. The process of claim 13, wherein the hydrolyzable zinc compound is selected from the group consisting of diethylzinc, bi(cyclohexyl) zinc, zinc 2-methoxyethoxide, and a mixture thereof, and the liquid is a mixture of toluene and tetrahydrofuran.

15. The process of claim 13, wherein the composition consists essentially of water, the liquid, an optional other semiconductor material, and the hydrolyzable zinc compound.

16. The process of claim 13, wherein the hydrolyzing accomplished a number of times converts more than about 80 mol % of the hydrolyzable zinc compound to the zinc oxide.

17. A process comprising:
   fabricating a thin film transistor comprising at least one semiconductor layer, a gate electrode; a source electrode; a drain electrode; and a gate dielectric, wherein the at least one semiconductor layer is formed by a semiconductor fabrication process comprising: performing on a composition including a hydrolyzable zinc compound a number of activities including:
(a) hydrolyzing at least a portion of the hydrolyzable zinc compound to form zinc oxide;
(b) liquid depositing; and
(c) optionally heating,
wherein the activities (a), (b), and (c) are each accomplished a number of times in any effective arrangement, resulting in the at least one semiconductor layer comprising the zinc oxide wherein the hydrolyzing accomplished a number of times converts a majority of the hydrolyzable zinc compound to the zinc oxide.

18. The process of claim 17, wherein the source electrode, the drain electrode, or both comprise a metal selected from the group consisting of aluminum, zinc, indium, silver, gallium, cadmium, tin, zinc-gallium oxide, indium-tin oxide, indium-antimony oxide, and the like.

19. The process of claim 17, wherein the composition consists essentially of water, an optional liquid, an optional other semiconductor material, and the hydrolyzable zinc compound.

20. The process of claim 17, wherein the hydrolyzing accomplished a number of times converts more than about 80 mol % of the hydrolyzable zinc compound to the zinc oxide.

* * * * *